(12) United States Patent
Sumi et al.

(10) Patent No.: US 6,706,975 B2
(45) Date of Patent: Mar. 16, 2004

(54) PASTE FOR FILLING THROUGHHOLE AND PRINTED WIRING BOARD USING SAME

(75) Inventors: Hiroshi Sumi, Ichinomiya (JP); Toshihumi Kojima, Komaki (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/904,097

(22) Filed: Jul. 13, 2001

(65) Prior Publication Data

US 2002/0033275 A1 Mar. 21, 2002

(30) Foreign Application Priority Data

Jul. 13, 2000 (JP) ........................................ 2000-212072

(51) Int. Cl.⁷ .............................................. H05K 1/11
(52) U.S. Cl. ...................... 174/264; 174/259; 438/637; 216/18
(58) Field of Search ........................ 174/259, 262–266; 216/18; 29/964, 852; 257/698; 438/125, 637, 639; 361/792–795, 748; 427/97

(56) References Cited

U.S. PATENT DOCUMENTS

| | | | | |
|---|---|---|---|---|
| 5,435,480 A | * | 7/1995 | Hart et al. | 228/180.1 |
| 5,450,290 A | * | 9/1995 | Boyko et al. | 361/792 |
| 5,879,568 A | * | 3/1999 | Urasaki et al. | 216/18 |
| 6,188,027 B1 | * | 2/2001 | Miller et al. | 174/262 |
| 6,365,843 B1 | * | 4/2002 | Shirai et al. | 174/262 |

FOREIGN PATENT DOCUMENTS

| | | | | |
|---|---|---|---|---|
| JP | 6-275959 | 9/1994 | ............ | H05K/3/46 |
| JP | 8-311157 | 11/1996 | ............ | C08G/59/20 |
| JP | 9-31307 | 2/1997 | ............ | C08L/63/00 |
| JP | 11-140280 | 5/1999 | ............ | C08L/63/00 |
| JP | 11-199759 | 7/1999 | ............ | C08L/63/00 |

* cited by examiner

Primary Examiner—David L. Talbott
Assistant Examiner—Jose H. Alcala
(74) Attorney, Agent, or Firm—Sughrue Mion, PLLC

(57) ABSTRACT

A paste for filling a throughhole, comprises: an epoxy resin; a curing agent; and a metal filler, wherein the metal filler is a powder comprising a base metal, and the curing agent is an imidazole compound represented by the following formula (1):

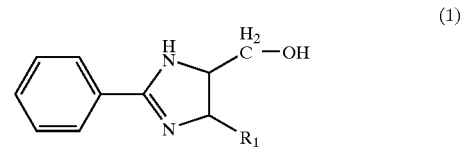

wherein $R_1$ represents a hydrogen atom, an alkyl group having 1 to 10 carbon atoms, a hydroxyalkyl group having 1 to 10 carbon atoms or an alkyloxy group having 1 to 10 carbon atoms.

7 Claims, 7 Drawing Sheets

PASTE FOR FILLING THROUGHHOLE AND PRINTED WIRING BOARD USING SAME

BACKGROUND OF THE INVENTION

1. Field of the Invention

This invention relates to a throughhole-filling paste to be filled into throughholes formed in a printed wiring board or a laminate board, and a printed wiring board and a multi-layer printed wiring board using the same.

2. Description of the Related Art

In recent years, a structure forming a via hole just above a throughhole (i.e., Via on PTH) for electrically connecting a conductor layer and the throughhole has been investigated (see Japanese Patent Laid-Open No. 275959/1994). In this structure, it is necessary to deposit copper on a throughhole-filling material filled in the throughhole. It is of importance to obtain a good adhesion of the copper deposit to the throughhole-filling material in order to obtain a high connection reliability.

In cases when a paste for filling throughholes that contains only an inorganic filler such as silica is used, it is required to rough the surface of the throughhole-filling material by subjecting it to a special chemical treatment using chromic acid or potassium permanganate. Thus, it is difficult to reduce production cost.

In order to improve adhesion to a copper deposit, it has been investigated to use a paste for filling throughholes that contains a metal filler such as copper (see Japanese Patent Laid-Open No. 140280/1999).

Figure 1:
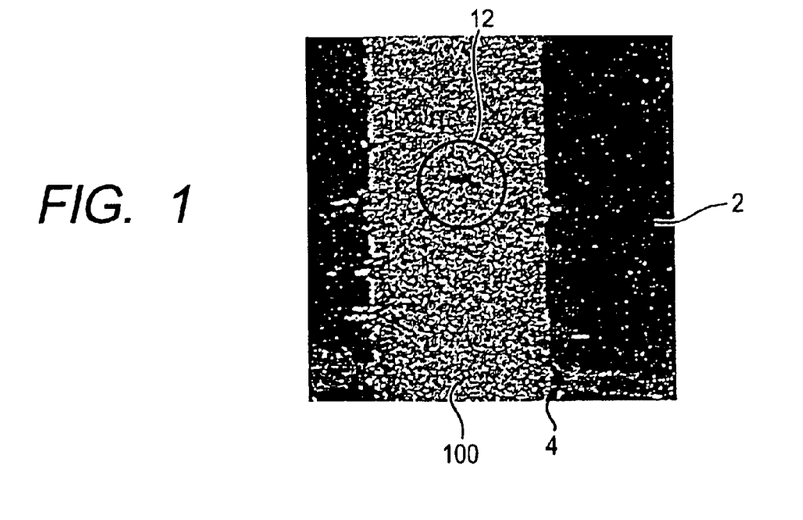
FIG. 1 is a diagram illustrating a gap developed within a cured throughhole-filling material.

However, use of a paste for filling throughholes that contains a copper filler can develop a crack-like gap (12) within a throughhole-filling material (100) after curing (see FIG. 1). This crack-like gap is not developed within the throughhole-filling material containing only an inorganic filler, but is liable to develop within a throughhole-filling material containing a metal filler such as copper.

This gap has been considered to be a crack caused by internal stress generated by shrinkage, upon curing, of a resin component of the throughhole-filling material. Accordingly, in order to prevent development of the crack-like gap, it has been studied to add an ingredient that imparts a good flexibility to a cured throughhole-filling material to thereby reduce internal stress (see Japanese Patent Laid-Open No. 311157/1996).

However, it is known that addition of the component which imparts a good flexibility causes a decrease of glass transition point (Tg) of a cured throughhole-filling material, which leads to reduction in heat resistance or increases shrinkage in volume in a solder reflow process (recuring shrinkage) (see Japanese Patent Laid-open No. 199759/1999). Such phenomena as reduction in heat resistance and recuring shrinkage are unfavorable factors which reduce reliability with respect to throughholes formed in a printed wiring board or a multi-layer wiring board.

As has been described hereinbefore, the paste for filling throughholes to which a good flexibility-imparting ingredient has been added has the problems of reduction in heat resistance or formation of dent (sinking or sink mark) on both sides when used as a throughhole-filling material, and hence the paste cannot have been used in the field where a high reliability is required, such as a package for MPU. Thus, it is not easy to obtain a printed wiring board or a multi-layer printed wiring board having a high reliability with respect to throughholes. In addition, pastes for filling throughholes undergo a large fluctuation of viscosity with time. This fluctuation must be depressed in order to obtain stable products. Further, a long shelf life of the products must be secured to ensure stable properties even after storage for a long period of time.

As to shrinkage behavior upon curing of a throughhole-filling paste containing a filler of a base metal such as copper, there is a large difference in curing rate between the central portion and surface portion (portion exposed to outer atmosphere) of a throughhole. To describe specifically, curing rate in the central portion of the throughhole is extremely slower than curing rate in the surface portion of the throughhole.

In consideration of these phenomena, the inventors have surmised that the above-described gap is not a crack due to internal stress as has conventionally been believed, but a so-called blow hole developed by migration of the resin component in the central portion where curing rate is slow to the surface portion where curing rate is fast.

Thus, the inventors have investigated change in curing behavior using various curing agents. As a result, the inventors have found that certain curing agents can control shrinkage behavior of the throughhole-filling paste upon curing to thereby depress development of the gap, thus having completed the invention based on the findings.

Base metals such as copper to be used as a metal filler are known to have a certain kind of catalytic action and exert some influences on the curing reaction of an epoxy resin (see Japanese Laid-Open No. 31307/1997). The problem about shrinkage behavior upon curing seems to be caused by variation of the catalytic effect depending upon oxidation state of the base metal surface. Specifically, anion polymerization is inhibited on a copper surface, whereas anion polymerization is accelerated on an oxidized surface.

SUMMARY OF THE INVENTION

In the invention, an imidazolic curing agent having the structure of formula (1) is used. The problem of developing gap to be caused when a throughhole-filling material containing a filler of base metal such as a copper powder can be avoided by using the curing agent of the invention. It is surmised that this imidazolic curing agent functions to adjust fluctuation of the catalytic action due to difference in surface state of the base metal to accelerate uniformity of the shrinkage behavior upon curing. A possible reason therefor is described later.

In these drawings, 1 designates a core substrate, 2 a substrate, 3 an inside (wall) surface of a hole, 4 a conductor layer, 5 a roughed surface, 6 a hydrophobic surface, 7 a conductor layer surface, 8 a water droplet, 80 contact point of water droplet with the surface of a conductor layer surface, 81 the top of a water droplet, 82 a hypothetical line, 83 a horizontal line, 9 an angle (θ), 10 a cured throughhole-filling material, 11 a dent (d), and 12 a gap.

DETAILED DESCRIPTION OF THE INVENTION

In general, epoxy resins containing an imidazolic curing agent are said to undergo polymerization with forming an intramolecular complex (see Kobunsi Kankokai, "Nyumon Epoxy Jusi", pp. 98 to 99). It is believed that, when the intramolecular complex is formed, polymerization-stopping reaction becomes difficult to take place, though reaction rate is decreased. That is, the reaction becomes difficult to be affected by outer influences which inhibit polymerization reaction of the epoxy resin. The inventors have surmised that, in order to accelerate uniformity of the shrinkage behavior upon curing, it is a critical point how to effectively form this intramolecular complex. Thus, the inventors have made investigation using various imidazolic curing agents and, as a result, have found that imidazolic curing agents having a special structure can accelerate uniformity of the shrinkage behavior of an epoxy resin upon curing, thus having completed the invention.

The imidazolic curing agents of the formula (1) to be used in the invention have a hydroxyl group (—OH) within the molecule. Formation of hydrogen bond between this hydroxyl group and an anion polymerization terminal group serves to more effectively form an intramolecular complex. As a result, the polymerization reaction becomes difficult to be affected by fluctuation of catalytic action of the base metal, supposedly leading to uniformity of the shrinkage behavior upon curing and effectively depressing development of the gap. Formula (1)

(1)

As preferred examples of $R_1$ in the formula (1), there are illustrated a hydrogen atom, an alkyl group containing 1 to 10 carbon atoms, a hydroxyalkyl group containing 1 to 10 carbon atoms or an alkyloxy group containing 1 to 10 carbon atoms. More preferably, there are illustrated a hydrogen atom, an alkyl group containing 1 to 4 carbon atoms (e.g., methyl group, ethyl group, propyl group, isopropyl group or butyl group), a hydroxyalkyl group containing 1 to 4 carbon atoms (e.g., hydroxymethyl group, hydroxyethyl group, hydroxypropyl group or hydroxybutyl group) or an alkyloxy group containing 1 to 4 carbon atoms (e.g., methoxy group, ethoxy group, propoxy group, isopropoxy group or butoxy group).

A particularly preferred imidazolic curing agent is an agent wherein $R_1$ is a methyl group, i.e., "2-phenyl-4-methyl-5-hydroxymethyl-imidazole". This curing agent can effectively depress development of the gap which is liable to be developed in a throughhole-filling material containing a copper powder. In addition, it can effectively depress formation of dents on the surface of both sides of the throughhole-filling material upon curing the throughhole-filling paste filled into a throughhole. Formation of dents on the surface of both sides of the throughhole-filling material causes formation of dent (sinking or sink mark) of a build-up layer to be subsequently formed, thus not being preferred. In particular, this becomes problematical in cases when pins are attached to a build-up layer just below throughholes as in FC-PGA type wiring substrate shown in Fig. The phrase "FC-PGA type wiring substrate" as used herein means a PGA (Pin Grid Array) to which a semiconductor element is FC (Flip Chip) mounted and is mounted on a mother board using pins.

The curing agent of the invention is particularly preferred for a throughhole having a large aspect ratio (1.6 to 32, preferably 2.5 to 32, more preferably 5 to 32, still more preferably 8 to 32) or a throughhole having formed on the inside surface a throughhole conductor with a rough surface having an average ten-point roughness Rz (according to JIS B 0601, 3.5.1) of 0.3 to 3 μm (preferably 2 to 3 μm) or having formed on the inside surface undulation or difference in level and lacking linear properties (for example, a throughhole formed by laser), or in cases when throughholes different in diameters are copresent (for example, throughholes of 100 μm in diameter and 300 μm in diameter being copresent) in a board and each of these throughholes is to be filled. Additionally, a throughhole conductor is preferably formed on the inside surface of the throughhole but, when a throughhole-filling paste having an electroconductivity is used, formation of the throughhole conductor may be omitted.

Figure 11:
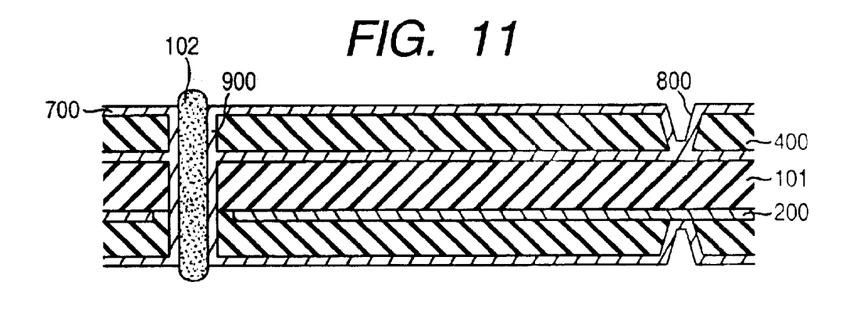
FIG. 11 is a diagram illustrating the state of a board comprising a core substrate having provided on both sides thereof an insulating layer after being subjected to panel plating.

As the board having throughholes therein to be used in the invention, so-called core substrates such as FR-4, FR-5 and BT are preferably used. However, those substrates which are prepared by forming throughholes in a core substrate comprising an about 35-μm thick copper foil sandwiched between thermoplastic resin sheets of, for example, PTFE may also be used. In addition, a board having a core substrate, an insulating layer formed on at least one side of the core substrate and a throughhole or throughholes formed through the core substrate and the insulating layer may also be used. FIG. 11 shows an example of a board comprising a core substrate having formed on both sides thereof an insulating layer through which a throughhole is formed. In this embodiment, the throughhole is preferably formed, after formation of the insulating layers, by means of a laser working machine using a carbonic acid gas laser or the like. Throughholes formed by using a laser have undulation or difference in level on the inside surface and lack linear properties, and hence filling of the throughholes is often difficult. However, the paste of the invention for filling throughholes has an advantage that it can be effectively filled into even throughholes formed by a laser in a board comprising a core substrate having formed on both sides thereof an insulating layer.

Figure 7:
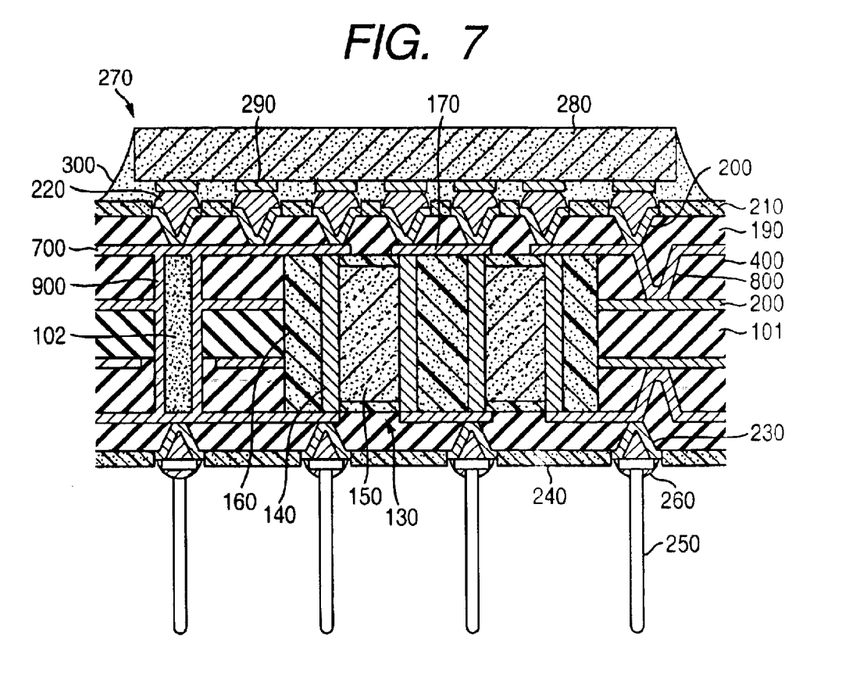
FIG. 7 is a diagram illustrating a semiconductor device using an FC-PGA type multi-layer printed wiring board used in Examples of the invention.

A multi-layer printed wiring board may be formed by alternately forming an insulating layer and a conductor layer to form a build-up layer on the printed wiring board obtained by the process of the invention for producing the printed wiring board. In this case, there is obtained an advantage that, even with a capacitor-built-in type, multi-layered printed wiring board as shown in FIG. 7, thickness of a so-called glass-epoxy composite material (insulating board) can be reduced to as thin as about 400 μm, which is half of the thickness of common products of 800 μm, serving to reduce entire thickness. In addition, the board having no gaps within the throughhole-filling material and having an excellent evenness of the build-up layer formed in the vicinity of a throughhole is particularly suited in the case of forming a PGA (Pin Grid Array) type multi-layer printed wiring board wherein pins are attached to the build-up layer right beneath a throughhole as an FC-GPA type wiring board shown in FIG. 7.

Methods for forming the build-up layer are not limited, and there may be employed a known additive method such as a semi-additive method or a full additive method, or a laminating method of laminating a core material of glass cloth, unwoven cloth of a heat-resistant resin or a metal foil with a prepreg of an insulating resin layer. In cases when the additive method is employed, a bare wiring surface should be subjected to a known rough surface-forming treatment such as chemical etching, blackening treatment or needle-like plating prior to formation of the build-up layer. Such treatment serves to improve adhesion to the insulating resin layer formed on the wiring surface. Surface of the thus formed insulating resin layer is then subjected to a treatment of making the surface rough, such as treatment with potassium permanganate or treatment with chromic acid, in order to improve adhesion to a conductor layer to be formed thereon. The conductor layer may be formed by a known method employing electroless plating, electroplating or photolithography.

The paste to be used in the invention for filling throughholes is based on a composition containing an epoxy resin, a metal filler and a curing agent. In order to obtain desired properties, a light-sensitive resin, a thermoplastic resin, an inorganic filler, an ultrafine inorganic filler a defoaming agent, etc. may properly be selected and added to the composition.

Since epoxy resins generally undergo less shrinkage upon curing, they are used for effectively depressing formation of dents after curing. In particular, use of aromatic epoxy resins excellent in heat resistance, humidity resistance and chemical resistance is preferred. More preferably, those epoxy resins which are liquid at ordinary temperature (BP type such as BPA type or BPF type, or PN type) are used to prepare solvent-free pastes.

The metal filler is used for more decreasing shrinkage upon curing, adjusting thermal expansion coefficient or viscosity of the paste, or for imparting electroconductivity to the throughhole-filling material. Addition of the metal filler also serves to effectively improve adhesion to the copper deposit formed on the throughhole-filling material. Atomized powder containing a slight amount of impurity oxygen is inexpensive and preferred. As the metal filler, a simple substance of base metal such as copper, nickel, iron or aluminium, an alloy containing at least two metals selected from the base metals and the other metals and, in addition, an inorganic filler coated with these metals or alloys (in the invention, such metal-coated inorganic fillers being included in the conception of metal filler) may be used. Additionally, with alloy powders, those alloys are preferred which are prepared using a noble metal such as Ag, Au or Pt.

As this metal filler, base metal powders such as copper powder or nickel powder is preferred. Atomized powders containing a slight amount of impurity oxygen are inexpensive and preferred, because they are inexpensive than noble metals. In particular, copper powder or copper alloy powder is preferred, because copper powder or copper alloy powder permits to conduct the plating process for forming a deposit on the throughhole-filling material in the same process as the common copper-plating process. With respect to the copper alloy powder, copper alloys with a noble metal such as Ag, Au or Pt are preferred.

As to shape of the metal filler, there are illustrated a spherical shape, a flake-like shape and a dendritic shape. Of these shapes, the spherical shape is preferred, because spherical metal fillers provide an improved fluidity to the paste, leading to excellent filling properties of the paste into a throughhole.

The metal filler has an average particle size of preferably 20 μm or less. If the average particle size exceeds 20 μm, there results a decreased adhesion to the copper deposit. The average particle size is more preferably 1 to 15 μm, still more preferably 3 to 10 μm, because metal fillers having such average particle size can effectively prevent generation of blister in the copper deposit. In addition, in order to improve the properties of filling a throughhole, it is preferred to use a metal filler having an apparent density of 2 $g/cm^3$ or more.

The paste of the invention for filling throughholes preferably contains an inorganic filler for the purpose of adjusting physical properties such as thermal expansion coefficient. As ceramics for constituting the inorganic filler, there may be used oxides (e.g., alumina and silica), nitrides (e.g., silicon nitride and titanium nitride), silicides (e.g., tungsten silicide and titanium silicide), and carbides (e.g., tungsten carbide and titanium carbide). In particular, fine alumina powders such as Taimicron or fine silica powders such as Aerosil are preferred. Additives to be added in a slight amount such as a defoaming agent and a leveling agent may further be added, if necessary.

The paste of the invention for filling throughholes preferably contains an ultrafine inorganic filler, which serves to depress viscosity change with time of the paste for filling throughholes. In addition, a dispersing agent may further be added. As the ultrafine inorganic filler, ultrafine ceramic powder is preferred. The "ultrafine" particles as used herein means those particles which have the following properties. (1) A specific surface area measured by BET method of 40 to 400 m$^2$/g. Since BET method is well known, detailed descriptions thereof are omitted here. Such particles can effectively prevent viscosity change with time of the paste for filing throughholes while maintaining fluidity upon filling the paste into a throughhole at a good level. Preferable range of the specific surface area of the particles measured by BET method is 60 to 100 m$^2$/g. Such particles can effectively depress formation of resin lumps or voids in the cured throughhole-filling paste which are to be caused upon filling the paste into throughholes. (2) A primary particle size of 5 to 50 nm. Sedimentation of the metallic filler in the throughhole-filling paste or change with time in viscosity can effectively be depressed by using ultrafine particles having a primary particle size of the order of nm. Preferable range of the primary particle size of the particles is 10 to 20 nm. Such particles do not increase viscosity of the paste for filling throughholes too much. (3) An apparent specific gravity of 30 to 200 g/l. Such particles are effective for preventing sedimentation of the metal filler in the throughhole-filling paste or depressing change with time in viscosity.

As the ultrafine inorganic filler, those fillers are preferred which show a pH value of 3.5 to 6.5 as a 4% dispersion (water:methanol=1:1). Thickening due to progress of curing of the throughhole-filling paste to be caused during use can effectively be depressed by adjusting the pH value to the acidic side to thereby reduce activity of the curing agent of the basic imidazolic compound at room temperature (25° C.). However, if the pH value is much less than 3.5, activity of the curing agent of the basic imidazolic compound is reduced so much that curing becomes insufficient, thus such pH value not being preferred. On the other hand, if the pH value exceeds 6.5 too much, viscosity becomes unstable, thus such pH value not being preferred. PH value of the 4% dispersion (water:methanol=1:1) of the ultrafine inorganic filler is measured by, for example, the following method. Description is given here using fine silica (Aerosil) as an ultrafine inorganic filler. 4 g of Aerosil is placed in a 200 ml beaker. 50 ml of methanol is added thereto, followed by stirring. Further, 50 ml of pure water is added thereto and stirred to well disperse. A glass electrode is placed into the dispersion to measure pH value. The dispersion is left till change in pH value for 5 minutes becomes +−0.01, and the value at the time is read off as a pH value of the ultrafine inorganic filler.

Carbon content of the ultrafine inorganic filler is preferably 3 to 5% by weight, which serves to improve wetting properties between the ultrafine filler and an epoxy resin. Detailed reasons for the improvement of wetting properties are not clear, but may be surmised as follows. That is, the carbon component adhering to the surface of the ultrafine inorganic filler prevents aggregation of the ultrafine fillers to each other based on intermolecular force or the like. It is also possible to surmise that carbon functions to remove static electricity to thereby prevent aggregation of the ultrafine particles based on static electricity.

Water content of the ultrafine inorganic filler is preferably 0.05 to 0.15% by mass. Such water content ensures stable viscosity among production lots of the paste for filling throughholes. If the water content is much less than 0.05% by mass, viscosity of the paste becomes unstable against change in atmospheric humidity, thus such water content not being preferred. On the other hand, if the water content exceeds 0.15% by mass too much, change in viscosity at the initiation of production becomes serious, thus such water content not being preferred.

The ultrafine inorganic filler has a purity of preferably 99.5% or more in terms of a major inorganic ingredient in the whole inorganic ingredient(s) excluding organic ingredient(s). This purity means a ratio of the major inorganic ingredient taking as 100 mass % the whole pure inorganic ingredients excluding organic ingredient(s) such as carbon. The ultrafine inorganic filler is uniformly dispersed in the whole throughhole-filling paste due to its fineness. Thus, presence of unnecessary impurities exerts detrimental influences (e.g., migration of metal ion) on the whole throughhole. In order to avoid such influences, it suffices to adjust the purity of inorganic ingredients to 99.5% or more.

The printed wiring board using the paste of the invention for filling throughholes has the advantage of excellent reliability of the throughholes, and hence it is suited for the use of a multi-layer printed wiring board using a build-up technology. In cases when Via-on-PTH structure is employed, too, the printed wiring board provides a stable connecting reliability. In addition, the printed wiring board has the advantage that, since it does not develop uneven surface or gap in the vicinity of the opening end of a throughhole, it can prevent failure such as slanting of pins or conjunction failure even in the case of attaching pins to a build-up layer right beneath the throughhole as in an FC-PGA type, multi-layer printed wiring board.

The throughhole-filling paste is useful particularly when the conductor layer formed on the surface of a core substrate constituting the printed wiring board or on the wall of a throughhole has been subjected to the hydrophobicity-imparting treatment so that contact angle to water becomes 90 degrees or more. Additionally, contact angle of a non-treated surface is usually 70 to 80 degrees, and contact angle after oxidation treatment (so-called blackening treatment) is usually 75 to 90 degrees.

Figure 5:
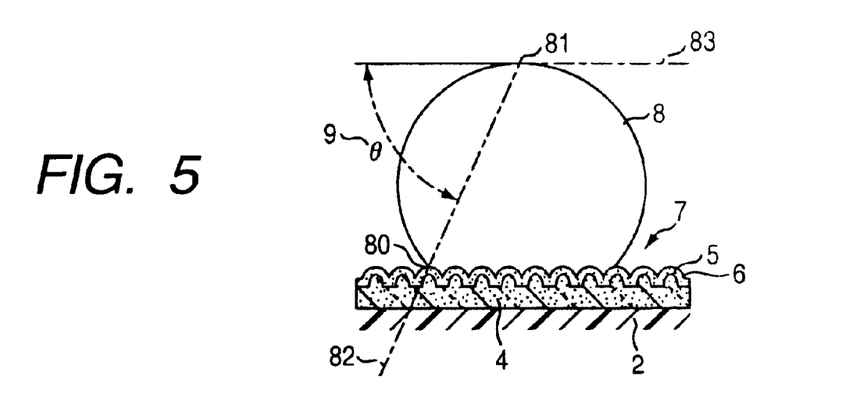
FIG. 5 is a diagram illustrating a method for measuring contact angle θ of a conductor surface to water.

The conductor layer (mainly copper) of a core substrate to be used in the printed wiring board of the invention is preferably subjected to a treatment of making the surface of the conductor layer hydrophobic, i.e., oleophilic using a coupling agent or a rust inhibitor (in particular, making contact angle of the surface to water (2θ) more than 90 degrees), in order to improve adhesion to an insulating layer or a solder resist, or to prevent rust-formation. Such treatment serves to improve wetting properties between the conductor layer surface and the oleophilic resin (for example, epoxy resin) (wetting properties with water reversely becoming poor), and adhesion to an insulating layer or a solder resist is improved. In order to improve adhesion, it suffices that contact angle of the surface to water is 95 degrees or more, particularly preferably 100 degrees or more. The term "contact angle (2θ)" as used herein means a double angle (2θ) of an angle (θ) formed by a hypothetical line (82) drawn from a contact point (80) of a water droplet (8) with a conductor surface (7) to the top (81) of the water droplet and a horizontal line (83) (see FIG. 5).

In general, however, with the increase in wetting properties between the oleophilic surface of the conductor layer and a resin, there results an increased bleedout (resin flow upon thermal curing) and a decrease in the throughhole-filling properties of the throughhole-filling paste. However, the throughhole-filling paste of the invention has the advantage that it can fill throughholes formed in a core substrate having a conductor layer which has been treated to be made hydrophobic so that contact angle thereof to water becomes 90 degrees or more (i.e., having a high oleophilicity).

At least part of the surface of the conductor layer to be used in the printed wiring board of the invention has a roughness Rz of preferably 0.3 to 20 μm, more preferably 0.5 to 10 μm, still more preferably 1 to 5 μm. It is particularly preferred to rough at least the portion which is to be in contact with the throughhole-filling paste, for example, the portion of throughhole conductor layer formed on the inside surface of the throughhole. Because, the throughhole-filling paste encroach on the uneven surface of the conductor layer to exhibit anchor effect of improving adhesion. Methods of controlling the surface roughness Rz are not particularly limited, and any of known methods such as a microetching method and a blackening method may be employed.

The present invention is described in more detail by reference to embodiments of the invention which, however, are not construed as limiting the invention in any way.

EXAMPLE 1

Evaluation of Throughhole-filling Pastes
(1) Preparation of Throughhole-filling Pastes Epoxy resins, imidazolic curing agents, copper and silica fillers shown below were mixed in amounts shown in Table 1, and well dispersed using a three-roll mill to prepare throughhole-filling pastes.

Epoxy resins used are the following three resins.

| | |
|---|---|
| YL908 (trade name): | Bisphenol A type epoxy resin (made by Yuka Shell Epoxy Co., Ltd.) |
| E828 (trade name): | Bisphenol A type epoxy resin (made by Yuka Shell Epoxy Co., Ltd.) |
| E152 (trade name): | Phenol Novolak type epoxy resin (made by Yuka Shell Epoxy Co., Ltd.) |

Curing agents used are the following four agents.

| | |
|---|---|
| 2P4MHZ (trade name): | 2-Phenyl-4-methyl-5-hydroxymethyl-imidazole (made by Shikoku Chemicals Corporation) |
| 2PZ (trade name): | 2-Phenyl-4,5-dihydroxymethyl-imidazole (made by Shikoku Chemicals Corporation) |
| 2P4MZ (trade name): | 2-Phenyl-4-methyl-imidazole (made by Shikoku Chemicals Corporation) |
| 2PZ-OK (trade name): | 2-Phenyl-imidazole/isocyanuric acid adduct (made by Shikoku Chemicals Corporation) |

Inorganic fillers used are the following four fillers. "RY200S: fine silica (made by Nippon Aerosil Co., Ltd.)" as used herein is an ultrafine inorganic filler.

| | |
|---|---|
| SFR-CU-5 (trade name): | Spherical copper filler of 5 vm in average particle size (made by Nippon Atomized Metal Powders Corporation) |
| SFR-CU-10 (trade name): | Spherical copper filler of 10 vm in average particle size (made by Nippon Atomized Metal Powders Corporation) |
| SOC2 (trade name): | Spherical silica filler of 0.5 vm in average particle size (made by Tatsumori) |
| RY200S (trade name): | Fine silica (made by Nippon Aerosil Co., Ltd.) of 76 m²/g in specific surface area measured according to BET method, 16 nm in primary particle size (average), 99.9% or more in silica purity (purity of silica which is a major component of the whole inorganic ingredients), 50 g/l in apparent specific gravity, 0.089% by weight in water content, 4.3% by weight in carbon content, and 5.72 in pH value as a 4% dispersion |

(2) Hydrophobicity-imparting Treatment of Core Substrate

Figure 2:
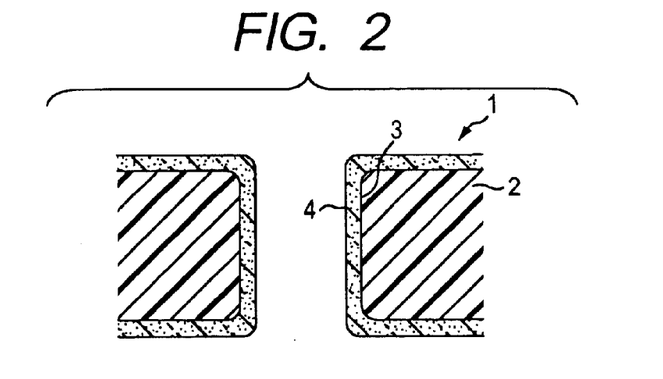
FIG. 2 is a diagram illustrating the step of making a core substrate hydrophobic.
Figure 3:
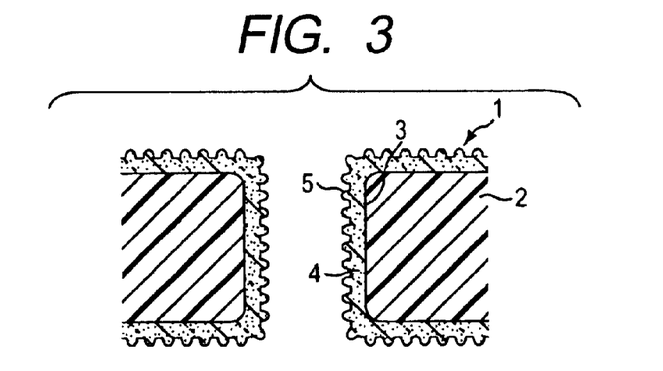
FIG. 3 is a diagram illustrating the step of making a core substrate hydrophobic.
Figure 4:
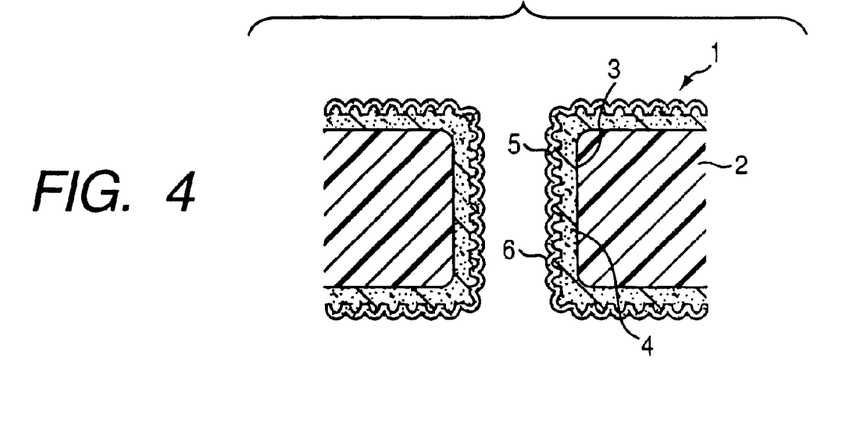
FIG. 4 is a diagram illustrating the step of making a core substrate hydrophobic.

As a core substrate (2), a copper-clad substrate of 800-μm thick BT (bismaleimide triazine) resin is used. After making throughholes by mechanical drilling, a 15-μm thick conductor layer (4) is formed by plating copper on the inside wall surface (3) of the hole to prepare a core substrate (1) having throughholes of 300 μm in diameter (see FIG. 2). The conductor layer surface of the thus obtained substrate is roughed using a commercially available microetching solution (trade name: MEC etch BOND; made by MEC) to thereby form a rough surface (5) (see FIG. 3). Then, the surface is treated with a commercially available rust inhibitor (trade name: CZ processing; made by MEC) to form a hydrophobic surface (6) to complete the hydrophobicity-imparting treatment (see FIG. 4).

Contact angle (2θ) of the hydrophobic conductor layer to water was measured according to a droplet method by means of a contact angle-measuring device (trade name: CA-A; made by Kyowa Interface Science Co., Ltd.) to be 101 degrees. The term "contact angle (2θ)" as used herein means a double angle (2θ) of an angle (θ) formed by a hypothetical line (82) drawn from a contact point (80) of a water droplet (8) with a conductor surface (7) to the top (81) of the water droplet and a horizontal line (83) (see FIG. 5).

(3) Throughhole-filling Test

Figure 6:
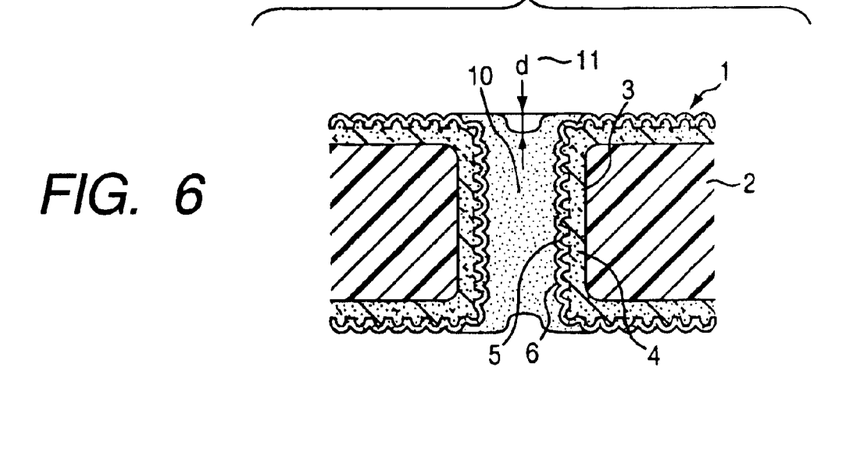
FIG. 6 is a diagram illustrating a dent d developed on the surface of a cured throughhole-filling material.

Each of the throughhole-filling pastes shown in Table 1 is filled into the throughhole in the core substrate (1). A paper is placed on a pedestal equipped with a vacuum suction apparatus, and the substrate is placed on the pedestal. A stainless steel-made, throughhole-filling mask having three kinds of openings of 200 μm, 300 μm and 400 μm is mounted thereon so that one of the openings of the mask are registered to the throughholes. Then, each of the throughhole-filling pastes shown in Table 1 is placed on the mask, and filling of the throughholes is conducted while applying pressure to a roller squeegee. Subsequently, pre-curing is conducted under the conditions of 120° C.×40 minutes, followed by curing under the conditions of 150° C.×5 hours to conduct thermal curing. Throughhole-filling properties are evaluated as follows. Samples developing a dent (d) exceeding 20 μm on the surface of cured throughhole-filling material (11) are evaluated as unacceptable (see FIG. 6). Samples wherein ratio of acceptable holes is 85% or more out of 100 throughholes are evaluated as acceptable. Results of whether acceptable or not are also seen in Table 1.

(4) Observation of Gap

The throughhole portion in the core substrate is cut, and the cut area is observed using a test glass (200×) to check for gap in the cured throughhole-filling material. Samples wherein ratio of acceptable holes is 85% or more out of 100 throughholes are evaluated as acceptable. Results of the observation are also seen in Table 1.

TABLE 1

| Sample No. | Epoxy Resin (wt %) | Curing Agent (wt %) | Metal Filler (wt %) | Inorganic Filler (wt %) | Sample Result of Throughhole-filling Test (% of Acceptable Holes) | Results of Observation of Gap (% of Acceptable Holes) |
|---|---|---|---|---|---|---|
| 1 | YL980 (95) | 2P4MHZ (5) | SFR-CU-5 (500) | RY200S (6) | 100 | 100 |
| 2 | E152 (87) E828 (8) | 2P4MHZ (5) | SFR-CU-10 (500) | RY200S (6) | 100 | 100 |
| 3 | YL980 (95) | 2PHZ (5) | SFR-CU-5 (500) | RY200S (6) | 90 | 100 |
| 4 | YL980 (95) | 2P4MZ (5) | SFR-CU-5 (500) | RY200S (6) | 100 | 77 |
| 5 | YL980 (95) | 2PZ-OK (5) | SFR-CU-5 (500) | RY200S (6) | 78 | 75 |
| 6 | YL980 (95) | 2P4MZ (5) | — | SOC2 (100) | 100 | 100 |

Sample Nos. 1 to 3 of Examples using the imidazolic curing agents having a structure of the formula (1) did not develop any gap, and provided good results. In particular, sample Nos. 1 and 2 using the imidazolic curing agent wherein $R_1$ is a methyl group scarcely formed a dent (less than 10 μm), thus good throughhole filling being conducted.

On the other hand, samples 4 and 5 of Comparative Examples using imidazolic curing agents not having hydroxyl group within the molecule developed a gap within the throughhole material. Additionally, sample No. 6 of Reference Example containing a silica filler in place of a copper filler used in sample No. 4 of Comparative Example did not develop any gap. It is seen from this that formation of gap is a phenomenon essential to the case of using a copper filler.

EXAMPLE 2

Example of FC-PGA Type, Multi-layer Printed Wiring Board (1) Preparation of a Semiconductor Device Using an FC-PGA Type, Multi-layer Printed Wiring Board:

The multi-layer printed wiring board using the printed wiring board of the invention is described below by reference to an example of a so-called "FC-PGA" structure shown in FIG. 7.

Figure 8:
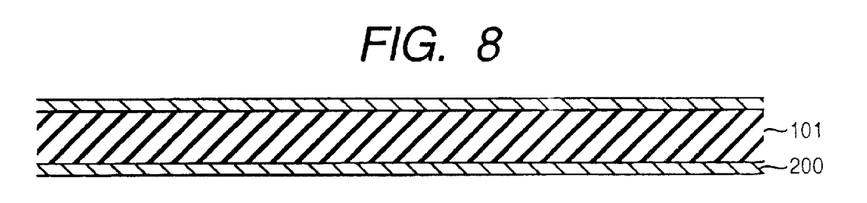
FIG. 8 is a diagram illustrating a 400-$\mu$m thick copper-clad core substrate used in Examples of the invention.

An FR-5 made double copper-clad core substrate comprising a 0.4 mm-thick insulating substrate (101) having attached thereon a 18-μm thick copper foil (200) as shown in FIG. 8 is prepared. This core substrate has a Tg (glass transition point) of 175° C. measured by TMA method, a CTE (Coefficient of Thermal Expansion) in substrate plane direction of 16 ppm/° C., a CTE (Coefficient of Thermal Expansion) in a vertical direction to the substrate plane of 50 ppm/° C., a dielectric constant ε at 1 MHz of 4.7, and tan δ at 1 MHZ of 0.018.

Figure 9:
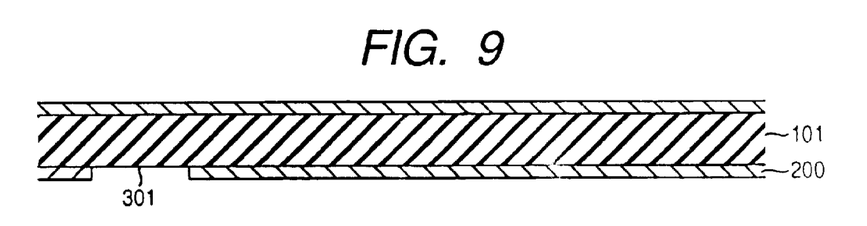
FIG. 9 is a diagram illustrating the state of a 400-μm thick copper-clad core substrate after patterning.

A photoresist film is applied to the core substrate, followed by exposure and development to thereby provide an opening of 600 μm in diameter and an opening corresponding to the predetermined wiring pattern (not shown). The copper foil laid bare at the opening of the photoresist film is etched away using an etching solution containing sodium sulfite and sulfuric acid. The photoresist film is delaminated away to obtain a core substrate having the exposed portion (301) as shown in FIG. 9 and the exposed portion corresponding to the predetermined wiring pattern (not shown).

The surface of copper foil is roughed by conducting etching treatment by means of a commercially available etching processor (made by MEC; CZ processor), and a 35-μm thick insulating film mainly composed of an epoxy resin is applied to both sides of the core substrate, followed by curing under the conditions of 170° C.×1.5 hours to form the insulating layers. This cured insulating layer has a Tg (glass transition point) of 155° C. measured by TMA method, a Tg (glass transition point) by DMA method is 204° C., a CTE (Coefficient of Thermal Expantion) of 66 ppm/° C., a dielectric constant ε at 1 MHz of 3.7, tanδ at 1 MHZ of 0.033, a weight loss at 300° C. of −0.1%, a water absorption of 1%, a Young's modulus of 3 GHz, a tensile strength of 63 MPa and an elongation percentage of 4.6%.

Figure 10:
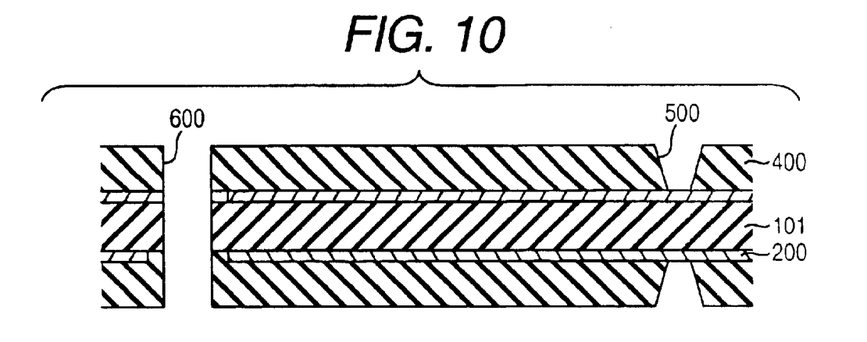
FIG. 10 is a diagram illustrating the state wherein a via hole and a throughhole are formed in a board comprising a core substrate having provided on both sides thereof an insulating layer.

As is shown in FIG. 10, a via hole (500) for interlayer connection is formed in the insulating layer (400) using a carbonic acid gas laser. The via hole is of a cone shape of 120 μm in diameter of the top surface and 60 μm in diameter of the bottom. The output power of the carbonic acid gas laser is raised to form a throughhole (600) which penetrates through the insulating layers and the core substrate. Three throughholes respectively having a diameter of 200 μm, 300 μm or 400 μm (not all shown) are formed. Inside surface of each of these throughholes has undulation (not shown) characteristic to the laser working. After dipping the substrate in a catalyst-activating solution containing palladium chloride, the whole surface thereof is subjected to electroless copper plating to form a copper deposit (not shown).

Subsequently, the whole surface of the substrate is coated with a 18-μm thick copper panel deposit (700). Here, a via hole conductor (800) for electric interlayer connection is formed on the via hole. In addition, a throughhole conductor (900) is formed on the throughhole which conductor functions to electrically connect both sides of the substrate to each other. Diameters of the throughholes after panel plating are 160 μm, 260 μm, and 360 μm, respectively. The surface of the copper deposit is made rough by an etching treatment using a commercially available etching processor (made by MEC; CZ processor), followed by treatment with a rust inhibitor (trade name: CZ processing) made by the same company to form a hydrophobic surface. Thus, hydrophobicity-imparting treatment is completed. Contact angle (2θ) of the hydrophobic conductor layer surface to water is measured according to the droplet method using a contact angle-measuring device (trade name: CA-A; made by Kyowa Interface Science Co., Ltd.) to be 101 degrees.

A paper is placed on a pedestal equipped with a vacuum suction apparatus, and the substrate is placed on the pedestal (not shown). A stainless steel-made, throughhole-filling mask having three kinds of openings of 200 μm, 300 μm and 400 μm is mounted thereon so that the openings of the mask are registered to the throughholes (not shown) to fill them at a time respectively. Then, each of the throughhole-filling pastes shown in Table 1 is placed on the mask, and conducting filling of the throughholes while applying pressure to a roller squeegee (not shown).

Figure 12:
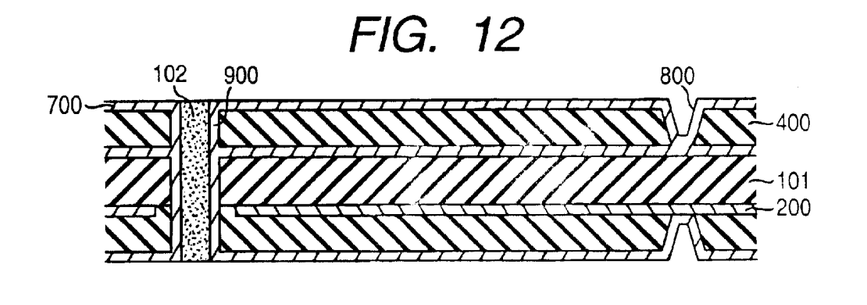
FIG. 12 is a diagram illustrating a board in which a throughhole is filled.

As is shown in FIG. 11, a throughhole-filling paste (102) filled into the throughhole is pre-cured under the conditions of 120° C.×20 minutes. Subsequently, the surface of the core substrate is abraded using a belt sander (coarse abrading), then buffed (finish abrading) to make the surface plane as shown in FIG. 12, followed by curing under the conditions of 150° C.×5 hours to complete the throughhole-filling process. Additionally, part of the thus throughhole-filled substrate is used for evaluation test on throughhole-filling properties.

Figure 13:
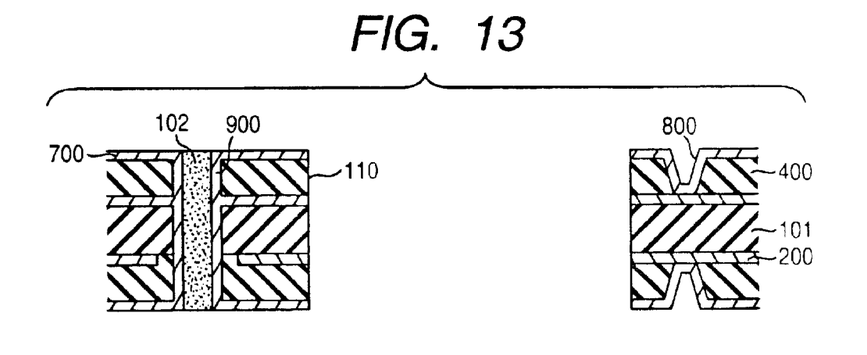
FIG. 13 is a diagram illustrating a board through which a housing hole is formed.
Figure 14:
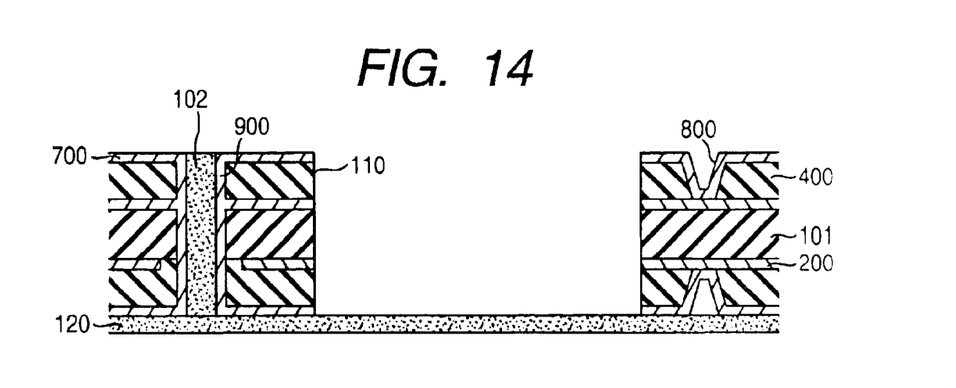
FIG. 14 is a diagram illustrating a state wherein a masking tape is applied to one side of a housing hole-containing board.
Figure 15:
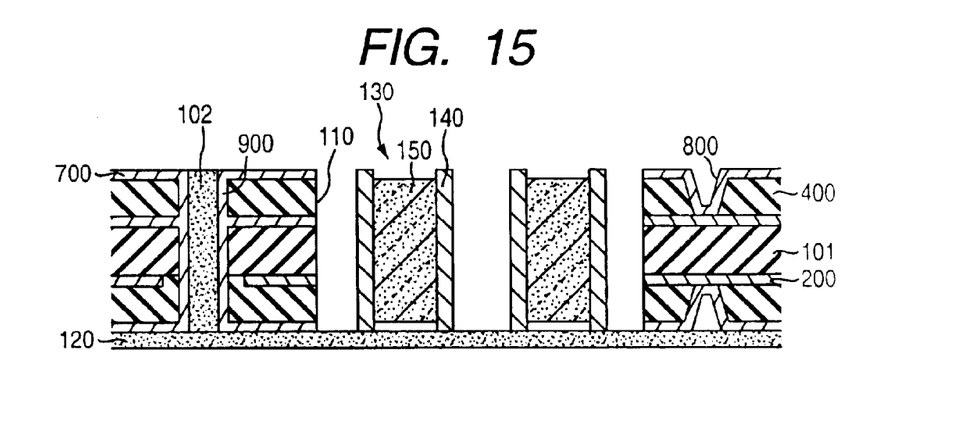
FIG. 15 is a diagram illustrating a state wherein layered chip capacitors are disposed on a masking tape laid bare inside a housing hole.

As is shown in FIG. 13, a housing hole having a square shape of 8 mm×8 mm (110) is formed using a metal mold (not shown). As is shown in FIG. 14, a masking tape (120) is applied to one side of the substrate. Then, as is shown in FIG. 15, 8 layered chip capacitors (130) are mounted on the adhesive surface of the masking tape laid bare in the housing hole (110) using a chip mounter. The layered chip capacitors comprises a laminate (150) wherein an insulating layer and a conductor are alternately formed and electrodes (140) are projecting 70 μm from the laminate.

Figure 16:
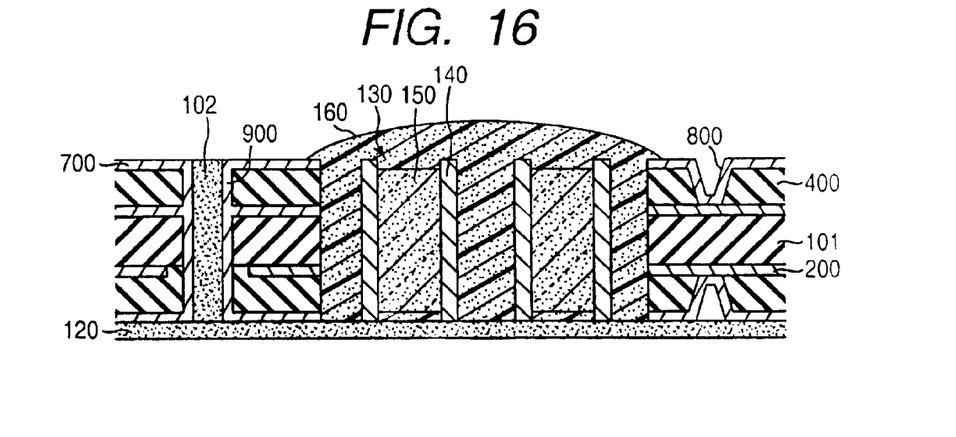
FIG. 16 is a diagram illustrating a state wherein an imbedding resin is filled into a housing hole.

As is shown in FIG. 16, an imbedding resin (160) mainly comprising an epoxy resin and a silica filler is filled into the housing hole where the layered capacitors are mounted using a dispenser (not shown). The imbedding resin is defoamed and thermally cured first under the conditions of 80° C.×3 hours in the primary heating step, then under the conditions of 170° C.×6 hours in the secondary heating step.

Figure 17:
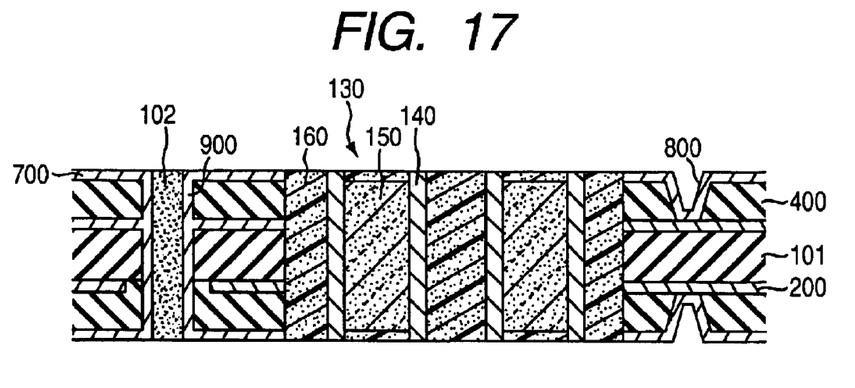
FIG. 17 is a diagram illustrating a state wherein the surface of a board is abraded to flatness.

As is shown in FIG. 17, surface of the cured imbedding resin is roughly abraded using a belt sander, then finish-abraded by lap abrading. The electrodes of the chip capacitors are laid bare on the abraded surface. Then, the pre-cured imbedding resin is cured under the conditions of 150° C.×5 hours.

Figure 18:
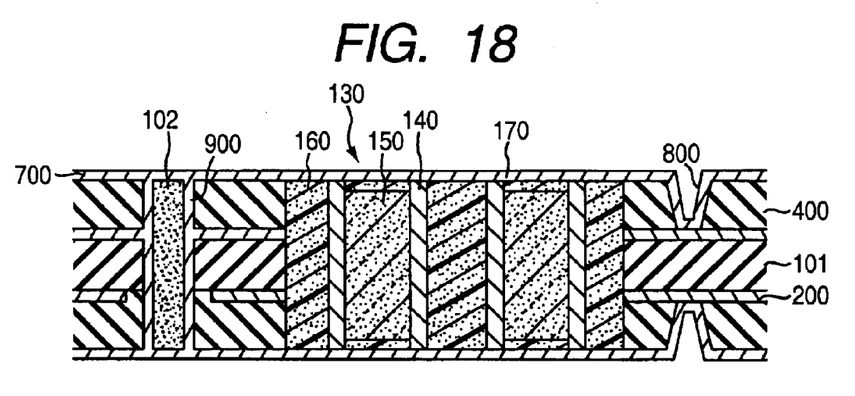
FIG. 18 is a diagram illustrating a state wherein the abraded surface is subjected to panel plating.
Figure 19:
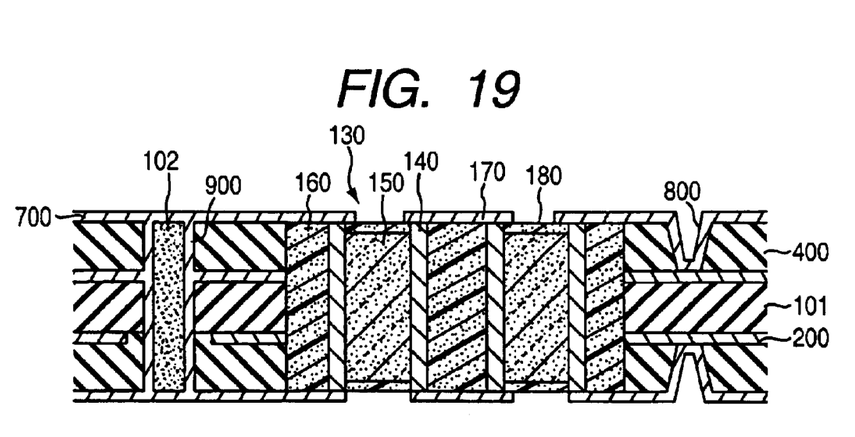
FIG. 19 is a diagram illustrating a state wherein wiring pattern is formed.

Subsequently, the abraded surface of the imbedding resin is roughed using a swelling solution and a $KMnO_4$ solution. After Pt catalyst-activating the rough surface, a copper deposit is formed thereon by first electroless plating and then electroplating. As is shown in FIG. 18, the copper deposit layer formed on the imbedding resin is electrically connected to the end surface of the electrodes of the chip capacitors. A resist is formed on the plated surface, and a predetermined wiring pattern is formed. Unnecessary copper portions are etched away using $Na_2S_2O_8$/conc. sulfuric acid. Then, the resist is delaminated to complete formation of wiring as shown in FIG. 19. Surface of the copper deposit of the wiring is etching-treated using a commercially available etching processor (MEC; CZ Processor) to make the copper deposit surface rough.

Figure 20:
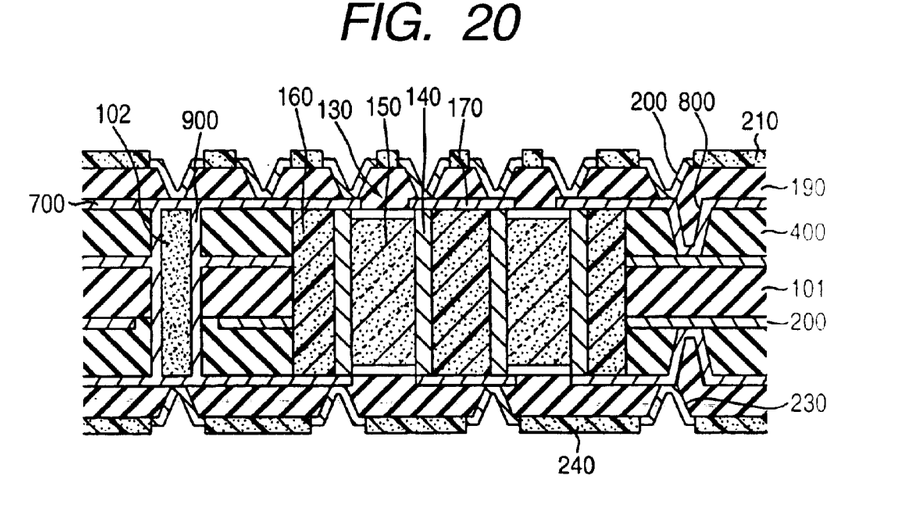
FIG. 20 is a diagram illustrating a state wherein a build-up layer and a solder resist layer are formed on a board.

An insulating layer-forming film (190) is laminated thereon and, after thermal curing, via holes for interlayer connection are formed by irradiating a carbonic acid gas laser. Surface of the insulating layer is roughed using the same oxidizing agent as above, and a predetermined wiring (200) is formed in the same manner. A solder resist layer-forming dry film is laminated on the uppermost surface of the wiring board, then a pattern for mounting a semiconductor element is formed by exposure and development to thereby complete formation of a solder resist layer (210). On the side to which pins are to be attached for mounting are also formed a predetermined wiring (230) and a solder resist layer (240) in the same manner to obtain a multi-layer printed wiring board to which pins are to be attached.

Terminal electrodes (200) to which a semiconductor element is mounted are subjected to plating with, successive, Ni and Au (not shown). A solder paste composed of a low-melting solder is printed thereon, then the board is passed through a solder reflow furnace to form solder bumps (220) for mounting a semiconductor element.

Figure 21:
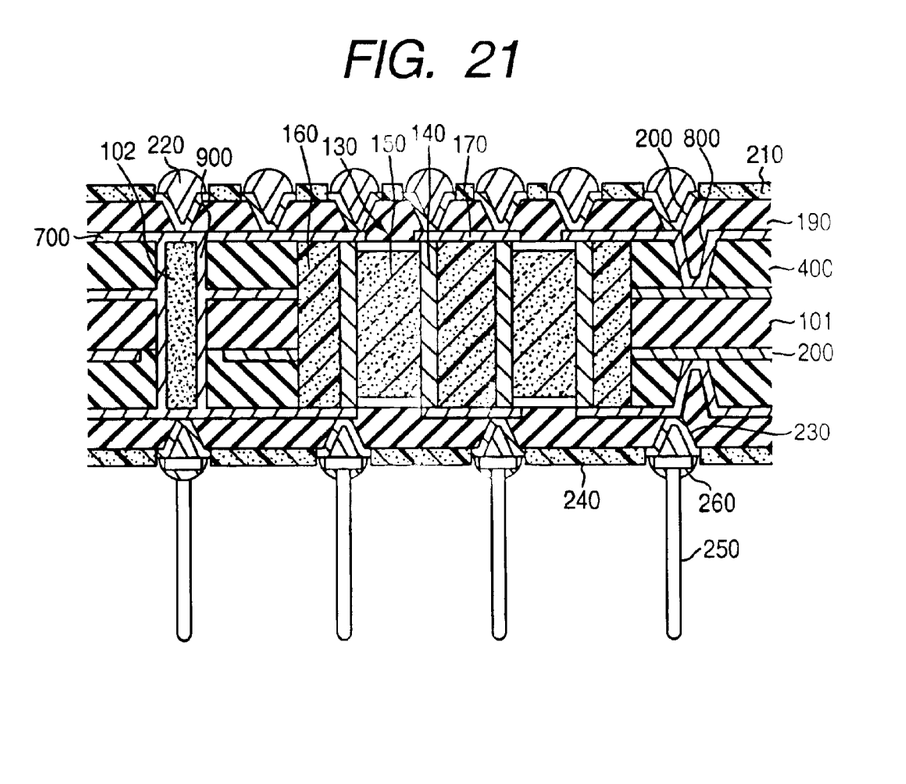
FIG. 21 is a diagram illustrating an FC-PGA type multi-layer printed wiring board.

On the other hand, on the side opposite to the semiconductor-mounting side is printed a solder paste composed of a high-melting solder, and the board is passed through a solder reflow furnace to form solder bumps (260) for attaching pins. The board is disposed on pins (250) supported by a jig (not shown), and passed through the solder reflow furnace to attach the pins (not shown) and, as is shown in FIG. 21, there is obtained an FC-PGA type multi-layer printed wiring board on which a semiconductor is to be mounted. Positional deviation from the predetermined position of the top of the pin is measured using a projector and is found to be as good as 0.1 mm or less.

A semiconductor element (270) is disposed at a position where it can be mounted on the semiconductor-mounting side, and the assembly is passed through a solder reflow furnace under the temperature condition of only melting the low-melting solder to thereby mount the semiconductor element. After filling an underfill material (300) into the mounted portion using a dispenser, thermal curing is conducted to obtain a semiconductor device using an FC-PGA type multi-layer printed wiring board on which a semiconductor element is mounted as is shown in FIG. 7.

FIG. 7 also shows a metal cover pad (170), a semiconductor die made of silicon (280), and metallic connecting pads (290).

(2) Evaluation of Throughhole-filling Properties

Tests for evaluating throughhole-filling properties are conducted using the board having been subjected to the throughhole-filling step. Presence or absence of failure such as cracks is visually examined from the terminal end of the throughhole-filling material using a test glass (×200).

On the other hand, in Comparative Examples, the throughhole-filling step is conducted according to a known screen printing method using a metal mask. Diameters of openings in the metal mask are the same as those in the supporting plate of Examples. After completion of filling, presence or absence of failure such as cracks is visually examined from the terminal end of the throughhole-filling material using a test glass (×200). Results thus obtained are shown in Table 2. Additionally, presence or absence of failure such as cracks is visually examined from the terminal end of the cured throughhole-filling material using a test glass (×200).

TABLE 2

| Sample No. | Throughhole-filling paste (corresponding to Sample No. in Table 1) | Results of Throughhole-filling Test (% of Acceptable Holes) | Results of Observation of Gap (% of Acceptable Holes) |
|---|---|---|---|
| 7 | (1) | 100 | 100 |
| 8 | (2) | 100 | 100 |
| 9 | (3) | 88 | 100 |
| 10 | (4) | 100 | 77 |
| 11 | (5) | 70 | 75 |
| 12 | (6) | 100 | 100 |

It is seen from Table 2 that, according to the invention, even throughholes which are formed through a board comprising a core substrate having formed on both side thereof a build-up layer and which has undulation on its inside surface can be filled with a cured material without developing failures such as filling failure or formation of gap upon curing. Even in cases when there exist a plurality of throughholes each having a different diameter, uniform filling can be attained. In addition, since uneven portions or gaps are not formed in the vicinity of the opening end of the throughhole, uneven portions are not formed on a build-up layer subsequently formed thereon. Thus, the invention is suited for a multi-layer printed wiring board having pins attached to pin-pads on the build-up layer formed right under the throughhole such as an FC-PGA type wiring board (see FIG. 21).

EXAMPLE 3

Evaluation of Influence of Physical Properties of Ultrafine Inorganic Filler on the Throughhole-filling Paste (1) Preparation of a Paste for Filling Throughholes Pastes for filling throughholes are prepared according to the formulation of Sample No. 1 of Example 1 except for changing the physical properties as described in Table 3. Preparation method is also analogous to that in Example 1. In some of the samples, alumina or Titania is used in place of Aerosil.

(2) Evaluation

Throughhole-filling test is conducted in the same manner as in Example 1. Results are shown in Table 3 wherein samples showing extremely good throughhole-filling properties are scored as oo (almost 100% acceptable), samples showing fairly good throughhole-filling properties (95% to less than 100% acceptable) are scored as o, and samples showing good throughhole-filling properties (85% to less than 95% acceptable) are scored as Δ. In addition, viscosity change with time is evaluated using samples having been left for 2 months after preparation of the paste for filling throughholes. State of the samples is confirmed after the 2-month leaving. Results are also shown in Table 3 wherein samples showing almost no increase in viscosity are scored as oo, samples showing a slight increase in viscosity are scored as o, and samples showing an increase in viscosity are scored as Δ.

It is seen from the results that viscosity change with time can effectively be depressed and good throughhole-filling properties can be obtained by adjusting physical properties of the ultrafine inorganic filler within specific ranges. Critical meanings of the ultrafine inorganic fillers are supplementally described below.

Sample No. 13 shows that a specific surface area larger than in this sample would increase the viscosity so much, which is not good for the throughhole-filling properties. In addition, it is seen that the lower limit of the primary particle size is 5 nm at the lowest. Sample No. 28 shows that a specific surface area smaller than in this sample would increase the change with time in viscosity so much, thus not being good. Sample No.26 shows that a primary particle size larger than in this sample would increase the change with time in viscosity so much, thus not being good.

Sample No. 14 shows that a pH value larger than in this sample would cause a large change with time in viscosity, thus not being good. Reasons therefor are not clear, but it may be possible to surmise that, when pH value reaches a more acidic level, there arises unfavorable side reactions with the basic curing agent. In addition, sample No. 19 shows that a pH value larger than in this sample would cause a somewhat large change with time in viscosity, thus not being preferred. Reasons therefor are not clear, but it may be possible to surmise that, when pH value reaches an unnecessarily basic level, some undesirable side reactions take place.

Sample 21 shows that a carbon content larger than in this sample would deteriorate the throughhole-filling properties. It may be possible to surmise that the carbon ingredient depresses aggregation caused by intermolecular force or the like, thus depressing change in viscosity. In sample No. 20 wherein the carbon content is 5% by weight, deterioration of physical properties is not conspicuous unlike sample No. 21. However, a higher content would cause troubles in plating a metal on the throughholes, thus not being preferred.

Sample No. 22 shows that a higher water content than in this sample would cause a large change with time in viscosity, thus not being preferred. It may be surmised that water exerts detrimental influences on the curing properties of the resin. Sample No. 23 shows that a water content less than in this sample would also cause a somewhat large

TABLE 3

| Sample No. | Specific Surface Area (m²/g) | Primary Particle Size (nm) | Apparent Specific Gravity (g/l) | pH | C Content (wt %) | Water Content (wt %) | Through hole-filling Test | Viscosity Change with Time | Ultrafine Inorganic Filler |
|---|---|---|---|---|---|---|---|---|---|
| 13 | 400 | 7 | 50 | 4.5 | 4 | 0.08 | Δ | Δ | Aerosil |
| 14 | 140 | 15 | 50 | 3.6 | 4 | 0.09 | o | Δ | Aerosil containing 1 wt % alumina |
| 15 | 120 | 10 | 50 | 5 | 4 | 0.09 | o | o | Aerosil |
| 16 | 100 | 18 | 50 | 5.5 | 4 | 0.08 | oo | oo | Aerosil |
| 17 | 100 | 15 | 50 | 5 | 4 | 0.06 | oo | oo | Alumina |
| 18 | 80 | 20 | 50 | 5.5 | 4 | 0.09 | oo | oo | Aerosil |
| 19 | 80 | 15 | 50 | 6.5 | 4 | 0.08 | oo | o | Aerosil |
| 20 | 80 | 16 | 50 | 5.5 | 5 | 0.09 | oo | o | Aerosil |
| 21 | 80 | 16 | 50 | 5.3 | 3 | 0.08 | oo | o | Aerosil |
| 22 | 80 | 16 | 50 | 5 | 4 | 0.15 | oo | Δ | Aerosil |
| 23 | 80 | 16 | 50 | 5.5 | 4 | 0.05 | oo | o | Aerosil |
| 24 | 60 | 26 | 50 | 5.3 | 4 | 0.07 | oo | oo | Aerosil |
| 25 | 50 | 20 | 130 | 4 | 4 | 0.08 | oo | o | Titania |
| 26 | 45 | 50 | 50 | 4.5 | 4 | 0.08 | oo | Δ | Aerosil |
| 27 | 45 | 20 | 200 | 3.5 | 4 | 0.08 | oo | Δ | Titania |
| 28 | 40 | 30 | 50 | 5.5 | 4 | 0.09 | oo | Δ | Aerosil | change with time in viscosity, thus not being preferred. It may be attributed to that the paste is presumably liable to absorb moisture in the working environment.

According to the invention, the throughhole-filling material containing a filler of a base metal such as copper can prevent formation of gaps within it after being cured without suffering a decrease in heat resistance and without forming a dent on both sides. In addition, since uneven portions or gaps are not formed in the vicinity of the opening end of throughhole, no uneven portions are formed on the build-up layer to be subsequently formed thereon. Since a board excellent in plane properties of the build-up layer in the vicinity of the throughhole is obtained, the invention is particularly suited for forming a PGA (Pin Grid Array) type multi-layer printed wiring board having pins attached to the build-up layer at positions right under the throughholes such as an FC-PGA type wiring board.

Although the invention has been described with respect to specific embodiments, the details are not to be construed as limitations, for it will become apparent that various embodiments, changes and modifications may be resorted to without departing from the spirit and scope thereof, and it is understood that such equivalent embodiments are intended to be included within the scope of this invention.

The entire disclosure of each and every foreign patent application from which the benefit of foreign priority has been claimed in the present application is incorporated herein by reference, as if fully set forth herein.

What is claimed is:

1. A printed wiring board comprising: a substrate having a conductor layer; and a throughhole penetrating through the substrate filled with a cured throughhole-filling material, said cured throughhole-filling material comprising, in admixture, a cured paste of an epoxy resin, a curing agent and a metal filler; the metal filler is a powder which comprises a base metal; and the curing agent is an imidazolic compound represented by the following formula (1)

wherein $R_1$ is selected from the group consisting of a hydrogen atom, an alkyl group containing 1 to 10 carbon atoms a hydroxyalkyl group containing 1 to 10 carbon atoms and an alkyloxy group containing 1 to 10 carbon atoms.

2. The printed wiring board according to claim 1, wherein the paste further comprises an inorganic filler.

3. The printed wiring board according to claim 1, wherein the paste further comprises an ultrafine inorganic filler.

4. The printed wiring board according to claim 1, wherein at least part of the surface of the conductor layer has been subjected to a treatment of imparting hydrophobicity so that the treated surface part has a contact angle against water of 90 degrees or higher.

5. The printed wiring board according to claim 1, wherein at least part of the conductor layer has been subjected to a roughing treatment so that the treated surface part has a roughness: Rz of 0.3 to 20 $\mu$m.

6. The printed wiring board according to claim 1, wherein the substrate comprises a core substrate having on at least one side thereof a build-up layer formed by alternately laminating an insulating layer and a conductor layer, and the throughhole penetrates through both the core substrate and the build-up layer.

7. A multi-layer printed wiring board, which comprises a printed wiring board according to claim 1, and a build-up layer formed by alternately laminating an insulating layer and a conductor layer.

* * * * *